| United States Patent [19] | [11] 3,962,496 |
| Leech | [45] June 8, 1976 |

[54] COMPOSITION AND METHOD FOR NEUTRALIZING AND SENSITIZING RESINOUS SURFACES AND IMPROVED SENSITIZED RESINOUS SURFACES FOR ADHERENT METALLIZATION

[75] Inventor: Edward J. Leech, Center Island, N.Y.

[73] Assignee: Photocircuits Division of Kollmorgen Corporation, Glen Cove, N.Y.

[22] Filed: Nov. 7, 1974

[21] Appl. No.: 521,866

[52] U.S. Cl. .................................... 427/306; 106/1; 427/304
[51] Int. Cl.² ........................................... C23C 3/02
[58] Field of Search ...................... 117/47 A; 106/1; 427/304, 305, 306

[56] References Cited
UNITED STATES PATENTS
3,620,804  11/1971  Bauer et al ....................... 117/47 A OTHER PUBLICATIONS
Plating on Plastics, G. Muller and D. W. Bandrach, Robert Draper Ltd, C–1971 pp. 103, 104.

"Electroless Plating Comes of Age," Brenner Metal Finishing Dec., 1954.

Modern Electroplating, John Wiley & Sons Inc. c–1974.

*Primary Examiner*—Ralph S. Kendall
*Assistant Examiner*—John D. Smith
*Attorney, Agent, or Firm*—Morgan, Finnegan, Pine, Foley & Lee

[57] ABSTRACT

A new composition and method for treating resinous surfaces that are to be metallized, and an improved sensitized substrate resulting therefrom. A resinous surface that has been conditioned by an oxidizer is treated with an aqueous solution comprising hydrazine to neutralize the surface and provide an improved sensitized surface for subsequent metallization. A preferred form of the solution also includes a pH adjuster and a sequestering agent.

20 Claims, No Drawings

COMPOSITION AND METHOD FOR NEUTRALIZING AND SENSITIZING RESINOUS SURFACES AND IMPROVED SENSITIZED RESINOUS SURFACES FOR ADHERENT METALLIZATION

Plating metal on synthetic organic substrates such as plastic or resinous surfaces requires several known procedures, including preparing the substrate with an oxidizer, neutralizing residual oxidizing agents, catalyzing the neutralized surface, and depositing the desired metal coating. See, for example, U.S. Pat. No. 3,625,758 to Stahl et al. and co-pending U.S. application Ser. No. 314,748, filed Dec. 13, 1972 now abandoned, the disclosures of which are hereby incorporated by reference.

It is an object of this invention, within the above framework, to provide an improved composition and method for neutralizing residual oxidizing agents.

It is a further object of the invention to provide an improved sensitized substrate surface for subsequent catalyzation and metallization.

An additional object of the invention is to permit increased deposition rates of the plating metal on to the catalyzed substrate during metallization.

It is also an object of the present invention to provide metal-plated plastic or resinous substrates exhibiting increased adherence between the deposited metal and the substrate surface, or, as this property is more commonly known in the art, having increased peel strength.

The above mentioned objects of the invention are met by utilizing a neutralizing solution including hydrazine or hydrazine hydrate following oxidation of the substrate surface to be metallized.

Prior to the present invention, it was known or suggested to use post-oxidation neutralizers such as bisulfite ions, sodium sulfite, ferrous salts such as ferrous sulfate, stannous salts such as stannous chloride, formaldehyde, hydroxylamine, sodium hydroxide or the like.

Although the theory is not precisely known, it is believed that in addition to neutralizing any residual oxidizer, hydrazine reacts with the surface oxidation products, such as carbonyl groups, on the substrate to form hydrazones, and that these surface-bound hydrazones, when contacted with weakly complexed metals, result in a substrate surface which is auto-catalytic to electroless metal deposition baths, which exhibits an increased rate of plating metal uptake, and which yields a plated article exhibiting superior peel strength. The average peel strength of hydrazine-neutralized plated substrates exceeds that of bisulfite-neutralized substrates by 35%. These improved properties may be attributable to the complexed metal being reduced right at the microporous surface of the substrate.

Substrates useful in the practice of the instant invention include any organic plastic or resinous material subject to oxidative attack, and should produce a polar, microporous, wettable surface following oxidation. These substrates may be molded articles, laminated articles, resin-coated articles and the like.

Among the organic materials which may be used to form the substrate to be metallized may be mentioned thermoplastic resins, thermosetting resins, and mixtures thereof.

Among the thermoplastic resins may be mentioned the acetal resins; acrylics, such as methyl acrylate; cellulosic resins, such as ethyl cellulose, cellulose acetate, cellulose propionate, cellulose acetate butyrate, cellulose nitrate and the like; chlorinated polyethers; nylon; polyethylene; polypropylene polystyrene; styrene blends, such as acrylonitrile styrene copolymer and acrylonitrile-butadiene-styrene copolymers; polycarbonates; polyphenyloxide; polysulfones; polychlorotrifluoroethylene; and vinyl polymers and copolymers, such as vinyl acetate, vinyl alcohol, vinyl butyral, vinyl chloride, vinyl chlorideacetate copolymer, vinylidene chloride and vinyl formal.

Among the thermosetting resins may be mentioned allyl phthalate; furane; melamine-formaldehyde; phenol formaldehyde and phenol-furfural copolymer, alone or compounded with butadiene acrylonitrile copolymer or acrylonitrile-butadiene-styrene copolymers; polyacrylic esters; silicones; urea formaldehydes; epoxy resins; allyl resins; glyceryl phthalates and polyesters.

A preferred embodiment includes the use of a substrate having a surface made up of an adherent resinous layer, the layer having uniformly dispersed therein finely divided particles of oxidizable and degradable synthetic or natural rubber. Such bases are disclosed in U.S. Pat. No. 3,625,758, which has been incorporated by reference.

Among the preferred applications of the invention is the use of substrates having a surface which has been treated prior to oxidation to render the surface temporarily polarized and wettable. Such treatments involve contacting the surface of the substrate to be metallized with an agent such as dimethyl formamide, dimethyl sulfoxide, N-methyl-2-pyrrolidone, ketones, halogenated hydrocarbons and mixtures thereof. With certain substrates, for example ABS resins, pretreatment with a strong solution of sulfuric, nitric, phosphoric or toluenesulfonic acid or a strong amine or the like is advisable. The pretreated substrate is then oxidized, or activated, in the known fashion with, for example, chromic acid or permanganate, or in the novel manner disclosed in co-pending U.S. application Ser. No. 314,748, filed 13 December, 1972 now abandoned, which has been incorporated by reference and which teaches the use of certain permanganate solutions as activating agents.

Following oxidation, the substrate is treated with an aqueous solution of hydrazine or hydrazine hydrate, resulting in the neutralization of the oxidizing agent, for example chromic acid or permanganate, and the accompanying evolution of nitrogen. The neutralization, which is almost spontaneous, is completed when the gaseous evolution of nitrogen ceases. The neutralizing solution preferably includes, in addition to hydrazine or hydrazine hydrate, a pH adjuster, such as a strong base, to maintain a favorable basic pH condition for hydrazine to act as a reducing agent, and a sequestering or chelating agent, such as an amine, to prevent the formation and collection of difficult to remove metallic oxides within the microporous surface of the substrate. Should such oxides be unwittingly carried over into an electroless metal bath, the oxides may cause the bath to behave erratically and result in, for example, passivation, spontaneous decomposition or extraneous deposition. This latter consideration is particularly important with respect to the use of permanganate in the oxidation step.

The pH adjuster is included only to provide a more favorable pH environment for the action of the hydrazine. Any material that will provide basic pH conditions without unduly hindering the effects of the other components of the composition will be suitable. Among the preferred pH adjusters are strong bases such as sodium and potassium hydroxide.

The sequestering or chelating agent has to form a sufficiently strong complex with the metal ions of the activating agent, for example chromium or manganese ions, to prevent the precipitation of oxides of these metals, and the complex formed should be soluble in the neutralizing solution. Although agents comprising a nitrogen-containing moiety, such as triethanolamine, are preferred, complexing or sequestering agents suitable for use in accordance with this invention include ammonia and organic complex-forming agents containing one or more of the following functional groups; primary amino (—$NH_2$), secondary amino (>NH), tertiary amino (>N—), amino (=NH), carboxy (—COOH), and hydroxy (—OH). Among these are agents such as ethylene diamine, diethylene triamine, triethylene tetramine, ethylenediaminetetraacetic acid, citric acid, tartaric acid and salts thereof, and ammonia. Related polyamines and N-carboxymethyl derivatives thereof may also be used.

Rochelle salts, the sodium (mono-, di-, tri-, and tetrasodium) salts of ethylenediaminetetraacetic acid, nitrilotriacetic acid and its alkali salts, gluconic acid, and gluconates are useful complexing agents; commercially available glucono-δ-lactonic and modified ethylenediamineacetates are also useful, one such material being N-hydroxyethylethylenediaminetriacetate. Other suitable materials are disclosed in U.S. Pat. Nos. 2,938,805, 2,996,408, 3,075,855, 3,075,856, and 3,645,749.

A good all-around hydrazine neutralizing solution consists of 100 ml/l 85% hydrazine hydrate in water, 100 ml/l 50% aqueous sodium hydroxide, 100 ml/l triethanolamine, and the remainder water. Another useful neutralizer comprises about 140 gm/l sodium tartrate, 100 ml/l 50% aqueous sodium hydroxide, 50 ml/l hydrazine hydrate, and the remainder water.

Irregardless of the activation procedure employed, for example, chromic/sulfuric, chromic/fluoboric, permanganate, alkaline permanganate, and so forth, it is usually preferred to utilize a primary neutralization step following activation and prior to contacting the treated material with the hydrazine neutralizer. The motive for the primary treatment may differ, depending on the actual activator employed, but it is usually beneficial. For example, if the activator contains chromic acid, primary treatment of the substrate with a solution comprising a strong base is preferred in order to minimize acid-base reactions in the hydrazine solution. It is also preferable for this primary treatment solution to contain a chelating agent capable of forming soluble complexes with chrome ions. If, for example, the activator is alkaline permanganate, primary treatment of the substrate with an acid reducing complex solution, comprising, for example, hydroxylamine hydrochloride, is preferred in order to effect bulk removal of manganese oxides from the treated substrate surface prior to treatment with the hydrazine solution.

Prior to the above described neutralization step, the substrate surface is greatly increased in surface area, having been rendered microporous in the activation step. The surface carbonyl groups formed in the oxidation step are believed to be converted to hydrazones during neutralization with hydrazine. In any event, when the substrate has been treated in the recommended fashion, it is sensitized, and if it is then treated with a solution comprising weakly complexed metal ions, such as palladium, silver or the like, the substrate is catalyzed when these ions are reduced at the microporous substrate surface to generate a metal-seeded surface that is catalytic to electroless metal deposition baths. The term "catalytic" as used herein refers to an agent or material which is catalytic to the reduction of the metal cations dissolved in electroless metal deposition solutions of the type to be described. The amount of catalytic agent used will vary depending upon the agent and the form in which it is used.

The sensitized substrate may be catalyzed be sequential treatment or seeding with aqueous solutions of stannous tin ions, or amine boranes, e.g., dialkyl amine boranes, such as dimethylamine borane, morpholine borane, isopropylamine borane, and the like; or alkali borohydrides, such as sodium or potassium borohydride, followed by or preceded by treatment with an aqueous solution of precious metal ions, e.g., palladium or silver. For example, one such treatment involves immersing the sensitized substrate first in an aqueous solution of stannous chloride, followed by washing, after which the substrate is immersed in an acidic aqueous solution of palladium chloride. Catalyzation may also be accomplished by soaking the sensitized insulating base material in a single aqueous solution comprising a mixture of stannous tin ions and precious metal ions, such as palladium ions, as described in U.S. Pat. No. 3,001,920. The precious metals which may be used in such seeding or catalyzing solutions include platinum, gold, rhodium, osmium and iridium, in addition to palladium or silver. Mixtures of such precious metals may also be used.

The catalyzed substrate surface may be metallized electrolessly by contacting it with a variety of electroless metal solutions, such as copper, nickel and gold electroless metal solutions. Such plating solutions are well known in the art and are capable of autocatalytically depositing the identified metals on insulating surfaces catalyzed as described without the use of electricity.

Another preferred application of the neutralizers and neutralization steps of the instant invention is with substrate surfaces or substrates that are catalytic throughout their entire mass to the deposition of electroless metal, for example, by containing a uniform dispersion of catalytic fillers as shown in U.S. Pat. Nos. 3,546,009 and 3,629,185, the disclosures of which are hereby incorporated by reference. The catalytic agent may be a salt or an oxide, or may be any of the metals of Groups 8 and 1B of the Periodic Table of Elements, compounds of any of these metals, or mixtures of them. Salts or oxides of iron, cobalt and iridium will ordinarily be used. The preferred type of catalytic filler in such applications is that known as PEC-8, the preparation of which is taught in U.S. Pat. No. 3,779,758, the disclosure of which is hereby incorporated by reference. When the present invention is used with such materials, the substrate to be plated proceeds from neutralization to the electroless metal deposition bath without the intervening catalyzation procedures heretofore described.

Electroless copper solutions which may be used are described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupric ions, e.g., tetrasodium ethylenediaminetetraacetic acid, and a pH adjuster, e.g., sodium hydroxide.

Electroless nickel baths which may be used are described in Brenner, Metal Finishing, November, 1954, pages 68 to 76, incorporated herein by reference. They comprise aqueous solutions of a nickel salt, such as nickel chloride; an active chemical reducing agent for the nickel salt, such as the hypophosphite ion; and a complexing agent, such as carboxylic acids and salts thereof.

Electroless gold plating baths which may be used are disclosed in U.S. Pat. No. 2,976,181, hereby incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid and salts thereof, such as the sodium, calcium and ammonium salts. The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 14, and the ion ratio of hypophosphite radical to insoluble gold salt may be between about 0.33 and 10 to 1.

Suitable electroless metal baths also include those described in U.S. application Ser. No. 314,748 now abandoned.

Utilizing the electroless metal baths of the type described very thin conducting metal films may be laid down. Ordinarily, the metal films superimposed by electroless metal deposition will range from 0.1 to 7 mils in thickness, with metal films having a thickness of even less than 0.1 being a distinct possibility.

The hydrazine composition and method of use disclosed herein result in superior processing characteristics in the art of metallizing insulated surfaces. Moreover, substrates having such sensitized insulated surfaces are useful articles of manufacture, providing a source of pre-treated articles ready for custom catalyzation or metallization and resulting in metal-plated articles exhibiting superior peel strengths. Metallized resinous surfaces have many commercial applications including, but not limited to, printed circuits or circuit boards, printed electric motors, lightweight decorative parts or articles, and other uses.

The following examples illustrate the use of a preferred hydrazine neutralizer following alkaline permanganate activation of the substrate surface. In each, the metallized substrate was post-cured at 120°–160°C for 30–60 minutes in order to maximize adhesion values.

EXAMPLE 1

A substrate having an epoxy-phenolic-nitrile rubber surface coating according to U.S. Pat. No. 3,625,758 is metallized by the following procedure:

a. immerse for about 15 minutes at about 70°C with agitation in a solution comprising:

| | |
|---|---|
| KMnO$_4$ | 40 g. |
| fluorinated hydrocarbon wetting agent (3M Fluorad FC 98) | .5 g. |
| water (to make) | 1000 ml. |
| NaOH (50% aqueous) | to pH 12.5 | b. rinse in still (not running) water for 3 minutes;

c. neutralize for 3 minutes at ambient temperature in a solution comprising:

| | |
|---|---|
| hydroxylamine.HCl | 20 g. |
| con. HCl (37% aqueous) | 300 ml. |
| water (to make) | 1000 ml. | d. rinse in running water for 3 minutes;
e. neutralize for 5 minutes at ambient temperature in a solution comprising:

| | |
|---|---|
| ethylenediaminetetraacetic acid (tetrasodium salt) | 146 g. |
| triethanolamine | 100 ml. |
| sodium carbonate | 50 g. |
| 100% hydrazine hydrate | 50 ml. |
| water (to make) | 1000 ml. | f. rinse in running water for 5 minutes; and
g. seeding and electroless metal processing as previously described.

EXAMPLE 2

Substrates upon which the subject adherent resinous coating had been laminated gave copper depositions having the following peel strengths as a function of varied immersion times in step (a) of Example 1, with all other steps being as previously described:

| Immersion Time (minutes) | Adhesion (lb/in. of width) |
|---|---|
| 5 | 21.4 |
| 10 | 27.1 |
| 15 | 42.7 |
| 20 | 41.7 |

EXAMPLE 3

Substrates upon which the subject adherent resinous coating had been dip coated were treated as in Example 2, with the following results:

| Immersion Time (minutes) | Adhesion (lb/in. of width) |
|---|---|
| 5 | 22.0 |
| 10 | 25.4 |
| 15 | 23.1 |
| 20 | 15.3 |

EXAMPLE 4

Substrates with a coating according to Example 2 were treated according to Example 2 except that the temperature of the bath in step (a) of Example 1 was lowered to about 60°C, with the following results:

| Immersion Time (minutes) | Adhesion (lb/in. of width) |
|---|---|
| 5 | 12.7 |
| 10 | 13.5 |
| 15 | 12.5 |
| 20 | 13.9 (occasional blistering) |

As indicated by the foregoing examples, and particularly Example 2, the disclosed neutralization, including treatment with hydrazine, produces electroless metal depositions having markedly superior peel strengths.

I claim:
1. In a process for producing a securely bonded layer of metal on a resinous surface by electroless metal deposition, the improvement which comprises the steps:
   a. treating the substrate to be metallized with an oxidizing agent;
   b. contacting the treated substrate with a primary neutralizer so as to effect bulk removal of said oxidizing agent from said substrate; and
   c. contacting the substrate with a composition comprising hydrazine and a sequestering agent capable of forming soluble complexes with at least one member of the group consisting of chromium ions and manganese ions, all prior to electroless metal deposition on said substrate.

2. The process of claim 1, wherein said sequestering agent comprises at least one member selected from the group consisting of ethylenediaminetetraacetic acid, sodium tartrate and triethanolamine.

3. The process of claim 1, wherein said composition also includes a pH adjuster.

4. The process of claim 3, wherein said pH adjuster comprises at least one member of the group consisting of sodium hydroxide, potassium hydroxide and sodium carbonate.

5. The process of claim 1, including the additional step of contacting the substrate with a solution comprising precious metal ions.

6. The process of claim 5, wherein said precious metal ions comprise at least one member of the group consisting of palladium and silver.

7. The process of claim 1, wherein said resinous surface comprises a catalytic filler.

8. The process of claim 1, wherein said oxidizing agent comprises chromic acid and said primary neutralizer comprises a strong base.

9. The process of claim 8, wherein said primary neutralizer also includes a chelating agent capable of forming soluble complexes with chromium ions.

10. In a process for producing a securely bonded layer of metal on a resinous surface by electroless metal deposition, the improvement comprising the steps:
    a. treating the substrate to be metallized with an oxidizing agent comprising a member of the group consisting of chromic acid and permanganate ions;
    b. contacting the treated substrate with a primary neutralizer so as to effect bulk removal of said oxidizing agent from said substrate; and
    c. contacting the substrate with an aqueous composition comprising hydrazine, a sequestering agent capable of forming soluble complexes with at least one member of the group consisting of chromium ions and manganese ions, and a pH adjuster, all prior to electroless metal deposition on said substrate.

11. The process of claim 10, wherein said pH adjuster comprises at least one member of the group consisting of sodium hydroxide, potassium hydroxide and sodium carbonate.

12. The process of claim 10, wherein said sequestering agent comprises at least one member of the group consisting of ethylenediaminetetraacetic acid, sodium tartrate and triethanolamine.

13. A process for producing a securely bonded layer of metal on a catalytic resinous surface by electroless metal deposition, said process comprising the steps:
    a. treating the substrate to be metallized with an oxidizing agent;
    b. contacting the treated substrate with a primary neutralizer so as to effect bulk removal of said oxidizing agent from said substrate;
    c. contacting the neutralized substrate with a composition comprising hydrazine and a sequestering agent capable of forming soluble complexes with at least one member of the group consisting of chromium ions and manganese ions; and
    d. metallizing said substrate in an electroless metal deposition bath.

14. The process of claim 13, wherein said composition also comprises water and a pH adjuster.

15. The process of claim 14, wherein said pH adjuster comprises at least one member of the group consisting of sodium hydroxide, potassium hydroxide and sodium carbonate.

16. The process of claim 15, wherein said sequestering agent comprises at least one member selected from the group consisting of ethylenediaminetetraacetic acid, sodium tartrate and triethanolamine.

17. A process for producing a securely bonded layer of metal on a resinous surface by electroless metal deposition, said process comprising the steps:
    a. treating the substrate to be metallized with an oxidizing agent;
    b. contacting the treated substrate with a primary neutralizer so as to effect bulk removal of said oxidizing agent from said substrate;
    c. contacting the neutralized substrate with a composition comprising hydrazine and a sequestering agent capable of forming soluble complexes with at least one member of the group consisting of chromium ions and manganese ions;
    d. contacting the substrate with a solution comprising precious metal ions; and
    e. metallizing said substrate in an electroless metal deposition bath.

18. The process of claim 17, wherein said composition also comprises water and a pH adjuster.

19. The process of claim 18, wherein said pH adjuster comprises at least one member of the group consisting of sodium hydroxide, potassium hydroxide and sodium carbonate.

20. The process of claim 19, wherein said sequestering agent comprises at least one member selected from the group consisting of ethylenediaminetetraacetic acid, sodium tartrate and triethanolamine.

* * * * *